United States Patent [19]

Faini

[11] Patent Number: 4,720,641
[45] Date of Patent: Jan. 19, 1988

[54] INTELLIGENT ELECTRICAL POWER DEVICE WITH MONOLITHIC INTEGRATED CIRCUIT

[75] Inventor: Giuseppe Faini, Cavenago Brianza, Italy

[73] Assignee: SGS Microelettronica S.p.A., Catania, Italy

[21] Appl. No.: 872,488

[22] Filed: Jun. 10, 1986

[30] Foreign Application Priority Data

Jun. 10, 1985 [IT] Italy ................. 21087 A/85

[51] Int. Cl.⁴ .................... H02J 1/10; H02M 3/06
[52] U.S. Cl. ................... 307/18; 307/43; 307/109; 320/1
[58] Field of Search .................. 307/18–21, 307/23, 43, 46–48, 64–66, 296, 297, 109, 110; 320/1; 323/282, 288; 361/92

[56] References Cited

U.S. PATENT DOCUMENTS

| 3,555,399 | 1/1971 | Buchanan et al. | 307/43 |
| 4,072,965 | 2/1978 | Kondo | 320/1 |
| 4,143,282 | 3/1979 | Berard, Jr. et al. | 307/43 |

FOREIGN PATENT DOCUMENTS 2049329 5/1979 United Kingdom.

*Primary Examiner*—Vit W. Miska
*Attorney, Agent, or Firm*—Cushman, Darby & Cushman

[57] ABSTRACT

With a MOS power element is associated at least one CMOS pilot circuit supplied by a condenser charged with a voltage taken from the power circuit during the interdiction phases of the power element. The entire device is preferably enclosed in a single monolithic chip except for the condenser which remains outside.

2 Claims, 1 Drawing Figure

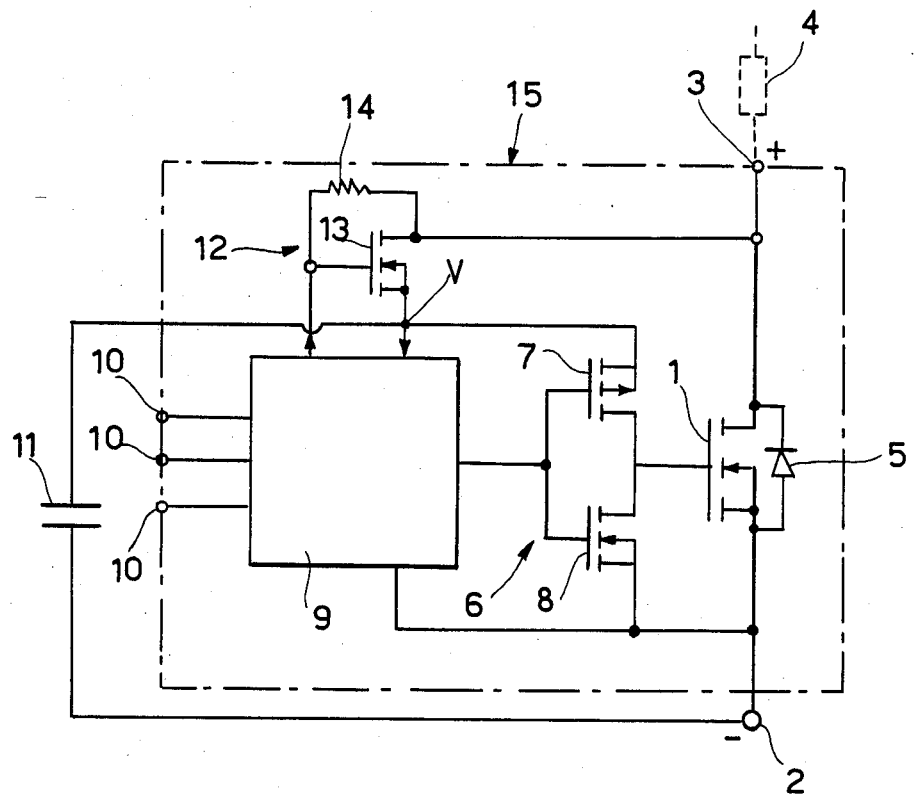

INTELLIGENT ELECTRICAL POWER DEVICE WITH MONOLITHIC INTEGRATED CIRCUIT

BACKGROUND OF THE INVENTION

The present invention relates to an intelligent electrical power device with monolithic integrated circuit.

So-called "intelligent" electrical power devices are those which include one or more internal piloting elements which can be used for ordinary switching of the power element and also for performing simple logic functions, overload protection and auxiliary functions in general.

In devices of the above type the piloting part normally requires a separate power supply.

OBJECT AND SUMMARY OF THE INVENTION

The object of the present invention is to accomplish an "intelligent" electrical power device which would take from its interior the power supply necessary for its own pilot circuit.

In accordance with the invention said object is achieved by a device characterized in that it comprises a MOS power element inserted in a power circuit for supply of a load, at least one CMOS pilot circuit associated with said power element in such a manner as to hold it in conduction by mere application and preservation of a charge on the power element gate, a condenser to supply the pilot circuit, and a condenser charging circuit, which operates in such a manner so as to take voltage from the power circuit and supply it to the condenser for the related charge during periods of power element interdiction (nonconducting state).

In other words, through the use of a condenser periodically recharged by said power circuit during power element interdiction periods, the device in accordance with the invention keeps its pilot circuit in operation without need of an outside power supply. This is made possible by combining a MOS power element with a CMOS pilot circuit which makes the conduction or interdiction condiction of the power element not determined by passage of a direct current but by acquisition or loss of a charge on the gate at the beginnning of the corresponding state. Holding the charge on the gate without passage of a current is a sufficient condition for maintaining the conduction state. This affords very small current consumption and hence employment of the condenser for supply of the pilot supply circuit.

It may happen that the power circuit is in conduction for periods longer than the condenser discharge circuit time constant so that the voltage taken is insufficient for recharging the condenser. To avoid this drawback a control logic circuit is preferably provided inside the device interdicting the power circuit for a very short time so as not to significantly alter operation and deviate all or part of the charge current to the condenser in such a manner as to bring voltage to said condenser heads back to the established value.

It is also preferable that the device in accordance with the invention be included in a single monolithic chip except for the condenser, which remains in this case the only external element.

BRIEF DESCRIPTION OF THE DRAWING

These and other characteristics of the present invention will be made clear by the following detailed description of a practical embodiment thereof illustrated as an example in the annexed drawing which shows the conceptual diagram.

DETAILED DESCRIPTION OF THE PREFERRED EMBODIMENT

With reference to the drawing, reference number 1 indicates a MOS power element inserted between a common negative terminal 2 and a positive terminal 3 connectable to a load 4. In parallel with the power element 1, more precisely between the drain and source electrodes, there is a diode 5. The power element 1 is preferably of a type capable of controlling voltages between 100 V and 1000 V and powers up to 10 kVA.

The gate of the power element 1 is controlled by a CMOS pilot circuit 6 made up of a P-MOS element 7 and an N-MOS element 8 which in turn is controlled by a logic control circuit 9 of the CMOS type provided with input terminals 10. The pilot circuit 6 controls the periodic switching of the power element 1 from conduction to interdiction and vice versa.

Supply for the pilot circuit 6 is provided by a condenser 11 to which during periods of interdiction of the power element 1 is applied a charge voltage V taken from the power circuit to which the element 1 belongs.

The charge voltage is supplied by a charge circuit 12 which comprises a MOS element 13 and a resistance 14 which supplies the control logic circuit 9 by which it is controlled.

All the circuitry elements described with the exception of the condenser 11 are included in a single monolithic chip 15.

In operation the pilot circuit 6 applies to each cycle start and then holds on the gate of the power element 1 a charge sufficient to hold in conduction said power element. Under this condition current consumption is very low and proportionate to the circuit switching frequency in accordance with the well known behaviour of CMOS circuits.

During the periods of conduction of the power element the pilot circuit 6 receives its power supply from the condenser 11.

During the periods of interdiction of said power element the charging circuit takes the voltage V from the power circuit and supplies it to the condenser 11 for charging.

If the power circuit conducts for periods longer than the discharge time of the condenser 11, the control logic circuit 9 intervenes to interdict the power circuit and entirely or partially divert the charge current to the condenser 11 until the voltage at its ends is brought back to the established value.

The benefits of the circuitry configuration described and illustrated are particularly significant in the case of power circuits with single-phase or multiphase bridges in which at least part of the source terminals of the power devices have different potential, and hence multiple external auxiliary sources would be required for the individual pilot circuits. The configuration described makes it possible to obtain the various auxiliary voltages inside each chip with considerable cost and simplicity benefits.

I claim:

1. An electrical power arrangement comprising:
   a MOS power element having a gate, source and drain, said source and drain adapted for connection between first and second source potentials, respectively, for supplying an output potential;

a CMOS pilot circuit connected to said power element in such a manner that it can maintain said power element in a conduction state by applying and preserving a potential on said gate;

a condenser for supplying a driving potential to said pilot circuit;

a charge circuit responsive to said output potential for charging said condenser with said output potential when said power element is in a non-conducting state; and logic means for causing said non-conducting state of said power element when said conduction state of said power element has a duration which exceeds the discharge time of the condenser.

2. An arrangement according to claim 1, wherein said power element, said pilot circuit, and said charge circuit are constituted by in a single monolithic integrated circuit chip.

* * * * *